United States Patent
Hoch et al.

(10) Patent No.: US 7,929,267 B2
(45) Date of Patent: Apr. 19, 2011

(54) SYSTEM COMPRISING AN AUTOMOTIVE FUSE AND AN A/D CONVERTER

(75) Inventors: Dietmar Hoch, Jena (DE); Christian Biberger, Mainburg (DE); Hardo Tumm, Kosching (DE)

(73) Assignee: Audi AG, Ingolstadt (DE)

( * ) Notice: Subject to any disclaimer, the term of this patent is extended or adjusted under 35 U.S.C. 154(b) by 1105 days.

(21) Appl. No.: 10/593,708

(22) PCT Filed: Mar. 23, 2005

(86) PCT No.: PCT/EP2005/003098
§ 371 (c)(1),
(2), (4) Date: Sep. 21, 2006

(87) PCT Pub. No.: WO2005/093773
PCT Pub. Date: Oct. 6, 2005

(65) Prior Publication Data
US 2009/0115401 A1 May 7, 2009

(30) Foreign Application Priority Data
Mar. 25, 2004 (DE) .......................... 10 2004 014 662

(51) Int. Cl.
*H02H 5/04* (2006.01)
(52) U.S. Cl. ....................................................... 361/104
(58) Field of Classification Search .................. 361/103, 361/104
See application file for complete search history.

(56) References Cited

U.S. PATENT DOCUMENTS

| 5,257,190 | A | 10/1993 | Crane | |
|---|---|---|---|---|
| 5,315,287 | A | 5/1994 | Sol | |
| 7,253,584 | B2 * | 8/2007 | Souther et al. | 320/104 |
| 2004/0036480 | A1 * | 2/2004 | Lin | 324/550 |
| 2004/0095986 | A1 * | 5/2004 | Tsuchiya | 374/163 |
| 2004/0130288 | A1 * | 7/2004 | Souther et al. | 320/104 |

FOREIGN PATENT DOCUMENTS

| DE | 299 11 177 | 12/1999 |
|---|---|---|
| DE | 202 14 002 | 11/2002 |
| DE | 102 22 146 | 2/2003 |

\* cited by examiner

*Primary Examiner* — Ronald W Leja
(74) *Attorney, Agent, or Firm* — Novak Druce + Quigg

(57) ABSTRACT

The invention relates to a system which comprises an automotive fuse and an A/D converter. Conventional systems comprising an automotive fuse and an A/D converter are designed such that a measured value is generated at the automotive fuse, which value is then amplified and passed on to the A/D converter via a long signal line. The novel space-saving system is characterized in that the A/D converter is located in close vicinity to the automotive fuse. The automotive fuse supplies the non-amplified, analog measured value for the input of the A/D converter. Signal transmission is carried out digitally via a bus system. It is especially advantageous if all components are housing in a common housing. Signal transmission is then carried out digitally via a bus system. The inventive system is suitable for use in data bus systems of vehicles.

7 Claims, 2 Drawing Sheets

SYSTEM COMPRISING AN AUTOMOTIVE FUSE AND AN A/D CONVERTER

This application is a U.S. National Stage of PCT/EP2005/003098, having been filed Mar. 23, 2005, which claims priority from DE 10 2004 014 662.4, having been filed on Mar. 25, 2004.

The invention relates to a system comprising an automotive fuse and an analog/digital converter.

BACKGROUND OF THE INVENTION

DE 299 11 177 U1 discloses a system with a measurement interface which detects and digitizes analog signals. This measurement interface is connected to a data bus which transmits the digitized measured values to other function units. The measurement interface for this purpose measures for example a time-variable voltage or time-variable current. This analog measurement signal or a signal proportional to it is then digitized by way of an analog/digital converter (A/D converter).

But in this connection the disadvantage is that special measurement devices, especially measuring shunts, which otherwise have no other functions, are required for this purpose. This measurement device and also the measurement interface require space.

Furthermore, systems are known which detect; the voltage drop on a measuring shunt which also performs the function of a fuse. This analog measurement signal is amplified and then relayed to a central measurement system by way of a long signal line.

The disadvantage in this system is that as a result of incident electromagnetic radiation onto long signal lines and/or the use of additional amplifiers the measurements become inaccurate or adversely affect the fuse function of the automotive fuse, when it is used as a measuring shunt. Moreover these systems are very complex with respect to wiring, since each measurement point must be wired separately. Since the known central measurement systems assume larger dimensions, there is no mobility or it is greatly limited, i.e., these systems are only suited to laboratory structures.

The object of the invention is to devise a system with an automotive fuse and an A/D converter with which on the one hand accurate measurements for relay to a data bus system can be achieved without influencing the fuse function for which a wire or a sheet is destroyed at overly high loading.

SUMMARY OF THE INVENTION

This object is achieved in that an A/D converter is connected directly at its input to the automotive fuse, said converter digitizing the analog measurement value measured here immediately and on site and then making available this digital value for further processing.

The advantage of this configuration consists in that this system works without error, delivers exact measured values, is for the most part invulnerable to electromagnetic radiation and can be built to save space. The digital value determined with precision from the analog measured value can be transmitted error-free even over greater distances, for example with a bus cable.

Advantageous developments arise from the dependent claims. In this context it is especially advantageous if the automotive fuse and the A/D converter are located in a common housing and this housing is a standard automotive fuse housing. Other advantages accrue when a processor receives the digitized measured value from the AID converter, its being advantageous when this processor is likewise located in the vicinity in the same housing as the automotive fuse and the A/D converter. Here it is advantageous that a temperature sensor for determining the ambient temperature is located on the automotive fuse used as a measuring shunt in the immediate vicinity, and optionally in the same housing as the automotive fuse, in order to be able to subject the analog or digitized measured value to temperature compensation.

DETAILED DESCRIPTION OF THE PREFERRED EMBODIMENTS OF THE INVENTION

Figure 1:
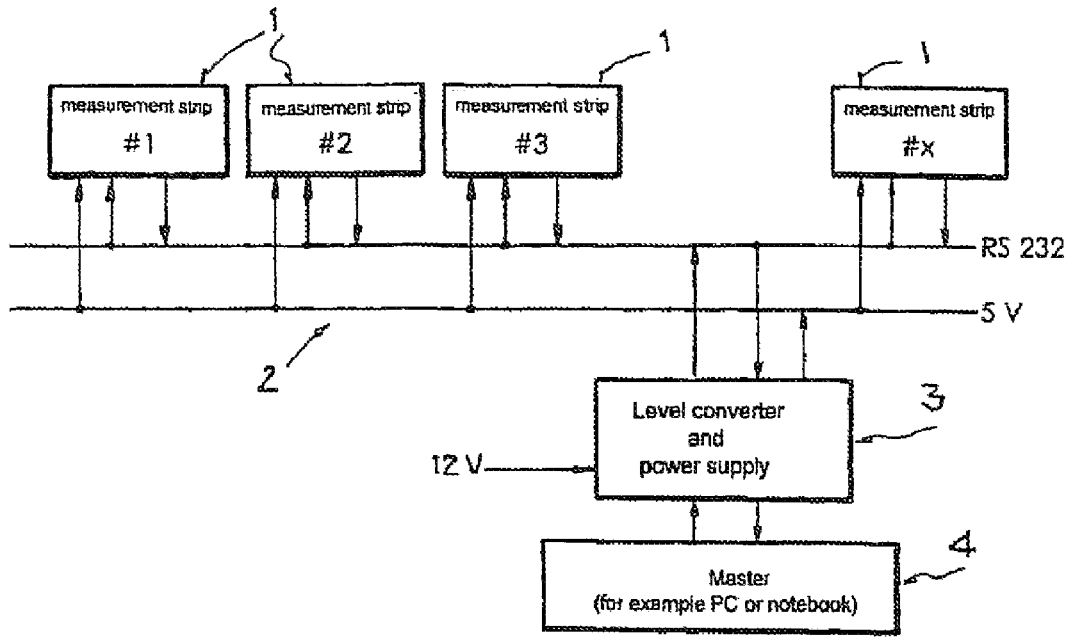
FIG. 1 shows a bus system with several systems as claimed in the invention

FIG. 1 shows several systems 1 as claimed in the invention which are connected to a bus system 2. The systems 1 which consist at least of one automotive fuse and an A/D converter are connected to the data bus 2. The systems 1 are in contact with control devices, circuits, function units, or similar devices which must be protected against overly high electrical loads via an automotive fuse. These devices produce signals which must be made available to the vehicle electronics for further processing. These signals must be measured and checked. In this connection, checking means that the signal level cannot cause damage. For this reason, as described later, an automotive fuse is needed. The system 1 digitizes the measured signal value and conditions it such that it can be sent by way of the data bus 2 for further processing. Likewise the data bus 2 supplies the systems 1 with the required voltage which can be tapped on a two-wire bus system. Furthermore, on the data bus 2 there is the level converter with the power supply 3 which in turn supplies the bus line 2 with power and which converts the digitized signals resulting from the determined measured values again and sends them to a master unit 4. This master unit 4 can be for example a personal computer (PC) or a personal digital assistant (PDA) which acquires the different signals, further processes them, and optionally based on the consequent results sends commands to the bus line for relay to the corresponding control devices, function units, or similar devices.

Figure 2:
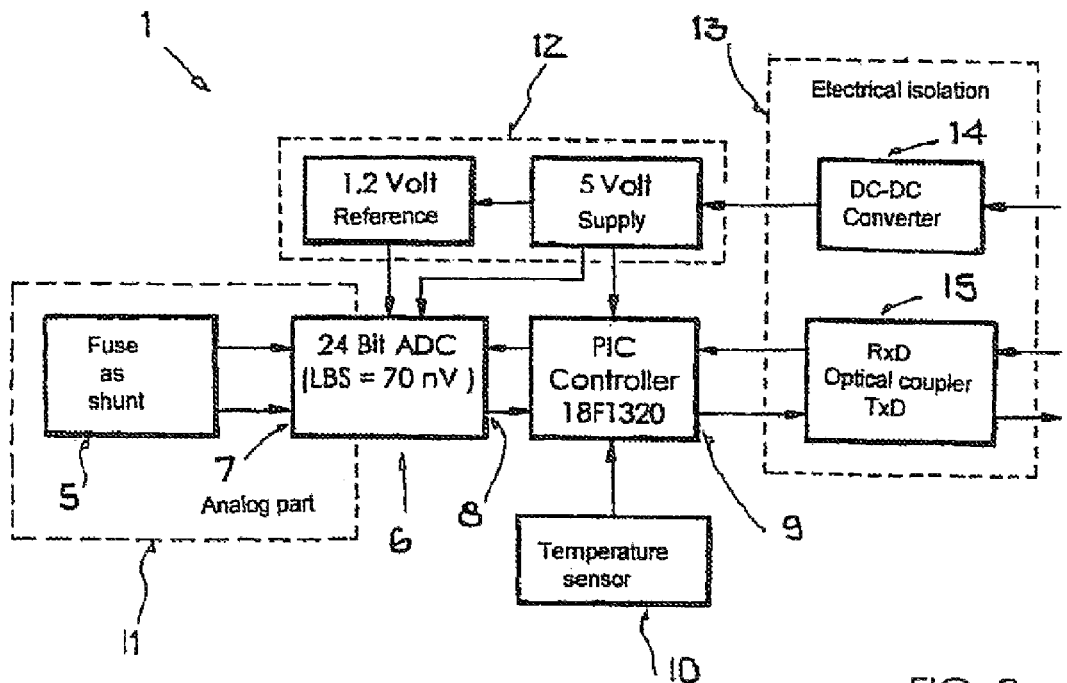
FIG. 2 shows a system with an automotive fuse and an A/D converter for digitizing measured values

FIG. 2 shows one embodiment for a system with an automotive fuse and an A/D converter for digitizing of measured values. The system 1 consists of an automotive fuse 5 which is available for example in a 5A, 10A, 20A, or 30 A version. This fuse 5 consists essentially of a conductor sheet or conductor wire which is melted or in some other way destroyed if an overly large current flows via it. In the immediately vicinity of the fuse 5 is the A/D converter 6. The A/D converter 6 is a 24 bit converter which has a LSB value of 70 nV (LSB=least significant bit). The input 7 of the A/D converter 6 is connected to the automotive fuse 5. This means that the measured value to be digitized is tapped on the fuse 5. The fuse 5 and the input 7 of the A/D converter 6 form the analog part 11 of the system 1. The analog measured value which is measured on the fuse 5 in the embodiment is the voltage on the fuse resulting in a flowing current or an analog voltage in a measurement without a fuse.

Furthermore, the A/D converter 6 is connected to a voltage unit 12 which makes available both the supply voltage and also the reference voltage for the A/D converter 6. In the embodiment the reference voltage is 1.2 V and the supply voltage is 5 V. In the A/D converter 6 the analog measured value is converted into a digital value; this digital value can be read out at the output 8 of the A/D converter 6. In the embodiment the A/D converter 6 is in contact with a processor 9, this processor 9 further processing the digital output value 8 of the A/D converter 6. This processor 9 is also connected to a temperature sensor 10 which determines the ambient temperature in the vicinity of the fuse 5. In the processor 9 temperature compensation takes place together with the determined temperature value. The available digital measured value of the converted analog value is evaluated by the processor 9 which is located in the immediate vicinity of the A/D converter 6 and if necessary is sent to a computer 4 via the bus system 2. At the same time, the temperature of the fuse 5 which is used for temperature compensation of the measured value is detected. The processor 9 in this embodiment assumes control of the A/D converter 6, computation of the current impressed via the voltage drop of the original fuse wire, and command-controlled communication and data transfer to the computer 4. The control of the A/D converter 6 includes read-out of data and adjustment of parameters of the A/D converter of this module. The computation includes conversion of the A/D value from the converter into a temperature-compensated current value. In this connection the measured temperature is used for temperature compensation of the A/D measured value. This takes place using a temperature-current characteristic field which is located for example in the nonvolatile storage of the processor 9. Data transfer to the computer is controlled by commands. The current can be synchronously measured, i.e., all fuses receive the command to measure and begin simultaneously with the measurement. Afterwards, the subscribers 1 on the bus 2 are read out in succession by the computer 4. Furthermore, in this embodiment there is electrical isolation 13 in the system 1. The electrical isolation 13 has an optical coupler 15 which sends the output signal from the processor 9 to the data bus 2, complete electrical decoupling from the fuse wire taking place. Furthermore, the electrical isolation 13 has a direct current-direct current converter (DC-DC converter) 14 which supplies the voltage unit 12 with power. The supply unit of the voltage unit 12 also supplies the processor 9 with power.

Figure 3:
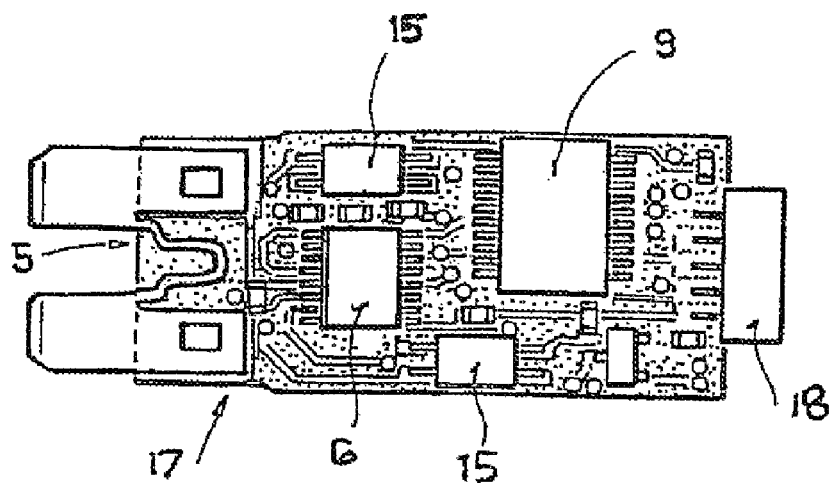
FIG. 3 shows a board with a system for digitizing of measured values

FIG. 3 shows a board with a system as shown in FIG. 2. In this embodiment the top of the board 17, which together with the bottom contains the complete system 1, is shown. Here, on the top are the conventional original automotive fuse 5, the A/D converter chip 6, the processor 9, the optical coupler 15 for electrical isolation of the bus system, and the plug 18 for linkage to the power supply and the serial bus system. With this system, very high measurement accuracy which had not been achieved with conventional measurement systems in the past can be attained. This structure can have for example the following technical data. Therefore this board can furthermore be used as a normal fuse and also fits into the fuse compartment for an automotive fuse in the vehicle. The technical data for this structure are the following, for example:

| | |
|---|---|
| Measurement range, current: | This corresponds to the inserted fuse of type 5 A, 10 A, 20 A, or 30 A. The total current can be measured. |
| Measurement range, voltage: | +/−60 volt (for measurement of an analog voltage without Si wire) |
| Measurement range, temperature: | −40° C. to +80° C. |
| Accuracy: | +/−100 µA, noise approx. +/−50 µA |
| Measurement method: | Original fuse wire as measuring shunt, digitization on the A/D converter and computation in the computer part directly on the fuse |
| Decoupling: | Complete decoupling of the vehicle by a direct current-direct current voltage supply and optically-decoupled signal lines |
| Number of measurement sites: | Up to 200 |
| Output measurement values: | Measured current, temperature on fuse |
| Measurement cycle: | Synchronous measurement, asynchronous data transmission, 100 measurement points are read out per second (fast measuring), one individual measurement with individual interrogation lasts approx. 200 ms |
| Temperature range: | −40° C. to 80° C. (application conditions) |
| Size of measurement strip: | approx. 14 mm × 30 mm |
| Bus system: | 2-wire, serial |
| Interface: | RS232C |
| System configuration: | 25, 50, or 100 measurement points, heterogeneous system with current, voltage and temperature measurement points on the same bus. |

With this structure it is possible to convert an analog measured value into a digital value and to digitally send this value for example via a bus system to other units, for example control devices, without transmission being faulty.

Figure 4:
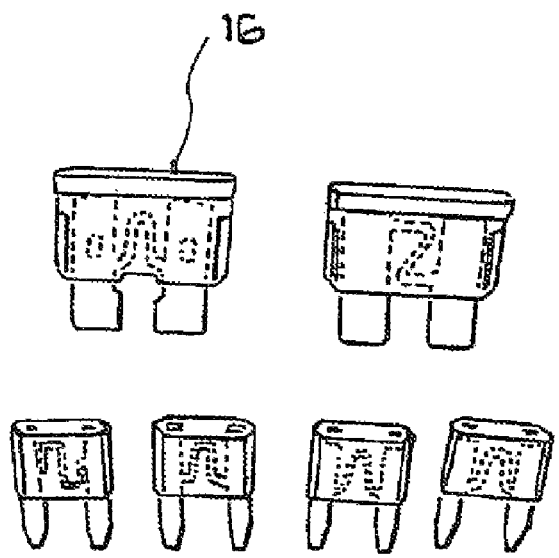
FIG. 4 shows housing shapes for systems for digitizing the measured values with integrated automotive fuse.

FIG. 4 shows different housing shapes for this system. The housings 16 correspond in dimensions to those of conventional automotive fuses. But inside they have at least one A/D converter 6 or even a board 17, as is shown in FIG. 3. This system can be positioned in a space-saving design at the same location at which the automotive fuse alone had been positioned previously. This yields a space-saving and economical structure.

With this measurement system it is possible to acquire measured values about the original commercial fuses located in the vehicle in operation without major wiring costs and with very high precision. The measured values are detected in analog form. Immediately afterwards the analog measured value is digitized and only then further processed.

This system can be used on a mobile basis and can remain in the vehicle without influencing the original fuse function of the automotive fuse.

This fuse module is especially advantageous in test vehicles which can remain there during the entire trial lifetime. But these systems can also be used for mass production vehicles.

The invention claimed is:

1. A module for interrupting at least one electrical circuit of a separate unit of a motor vehicle in an overload condition, comprising:
    a housing mountable on said vehicle having input means operatively connectable to said circuit and output means;
    a fuse disposed in said housing electrically connected to said input means; and
    an analog/digital converter disposed in said housing electrically interconnecting said fuse and said output means.

2. A module according to claim 1 including a processor disposed in said housing operatively interconnecting said analog/digital converter and said output means.

3. A module according to claim 2 including means disposed in said housing for sensing temperature in the vicinity of said fuse, operatively connected to said processor for compensation purposes.

4. A module according to claim 1 wherein said input means is connectable to one of a group consisting of control and function devices.

5. A module according to claim 1 wherein said output means is connectable to a data bus.

6. A module according to claim 1 wherein said input means of said housing is insertable in a socket provided on said vehicle.

7. A system comprising:
- at least one of a group consisting of electrically operable control and function devices mounted on a motor vehicle;
- a separate module providing a housing mounted on said vehicle, having an input operatively connectable to said one device, and an output;
- a fuse disposed in said housing electrically connected to said input means;
- an analog/digital converter disposed in said housing electrically interconnecting said fuse converter and said output; and
- a data bus operatively connecting said output and a remote processor.

* * * * *